(12) United States Patent
Takahashi

(10) Patent No.: US 8,129,610 B2
(45) Date of Patent: Mar. 6, 2012

(54) THERMOELECTRIC TRANSDUCER

(75) Inventor: Koh Takahashi, Tokyo (JP)

(73) Assignee: Universal Entertainment Corporation, Tokyo (JP)

( * ) Notice: Subject to any disclaimer, the term of this patent is extended or adjusted under 35 U.S.C. 154(b) by 752 days.

(21) Appl. No.: 11/630,150

(22) PCT Filed: Jun. 16, 2005

(86) PCT No.: PCT/JP2005/011025
§ 371 (c)(1),
(2), (4) Date: Mar. 12, 2007

(87) PCT Pub. No.: WO2005/124881
PCT Pub. Date: Dec. 29, 2005

(65) Prior Publication Data
US 2008/0087317 A1    Apr. 17, 2008

(30) Foreign Application Priority Data
Jun. 22, 2004    (JP) ................................. 2004-183998

(51) Int. Cl.
  *H01L 35/16*    (2006.01)
  *H01L 35/22*    (2006.01)
  *H01L 35/00*    (2006.01)
  *H01L 35/28*    (2006.01)
(52) U.S. Cl. .................... 136/238; 136/200; 136/224
(58) Field of Classification Search ........... 136/200–242
  See application file for complete search history.

(56) References Cited

U.S. PATENT DOCUMENTS

| 3,930,303 A | 1/1976 | Alais et al. |
| 6,282,907 B1 | 9/2001 | Ghoshal |
| 2003/0209014 A1 | 11/2003 | Chang et al. |
| 2004/0107988 A1 | 6/2004 | Harman et al. |
| 2006/0225773 A1 | 10/2006 | Venkatasubramanian et al. |

FOREIGN PATENT DOCUMENTS

| EP | 0 731 513 A1 |   | 9/1996 |
| JP | 3-66182 |   | 3/1991 |
| JP | 03-066182 | * | 3/1991 |
| JP | 03066182 A | * | 3/1991 |

(Continued)

OTHER PUBLICATIONS

Supplemental European Search Report dated Jan. 11, 2010.

(Continued)

*Primary Examiner* — Jessica L Ward
*Assistant Examiner* — Alexander Polyansky
(74) *Attorney, Agent, or Firm* — McGinn Intellectual Property Law Group, PLLC

(57) ABSTRACT

A thermoelectric transducer is provided, where a decrease in conversion efficiency due to uneven characteristics of semiconductors is resolved and a decrease in adhesion strength between each element unit and an electrode due to a heat expansion coefficient between the respective thermoelectric transducers. In addition, an improvement of electro thermal conversion efficiency is intended by modifying the structure of the single device. Single element unit (13), which are made off semiconductor of the same type constructed of sintered body cells each containing oxide of a metal element, an oxide of a rare-earth element, and manganese are arranged on a board (5, 12) of a thermoelectric transducer (10). Film-shaped thin-film electrodes are arranged on cooling and heating surfaces so to be integral with the sintered body cell. On these sides, lead wires (16) are connected to each other in series.

15 Claims, 6 Drawing Sheets

FOREIGN PATENT DOCUMENTS

| | | | |
|---|---|---|---|
| JP | 7-211944 | | 8/1995 |
| JP | 9-51126 | | 2/1997 |
| JP | 11-135842 | | 5/1999 |
| JP | 2003-142742 | * | 5/2003 |
| JP | 2003-282966 | | 10/2003 |
| JP | 2004-221375 | | 8/2004 |
| WO | WO 2004/049463 | | 6/2004 |

OTHER PUBLICATIONS

European Search Report dated Aug. 12, 2009.
Ichiro Matsubara, Ryoji Funahashi, Tomonari Takeuchi, and Satoshi Sodeoka, Fabrication of an All-Oxide Thermoelectric Power Generator, Applied Physics Letters, Jun. 4, 2001, vol. 78 No. 23, pp. 3627-3629.

* cited by examiner

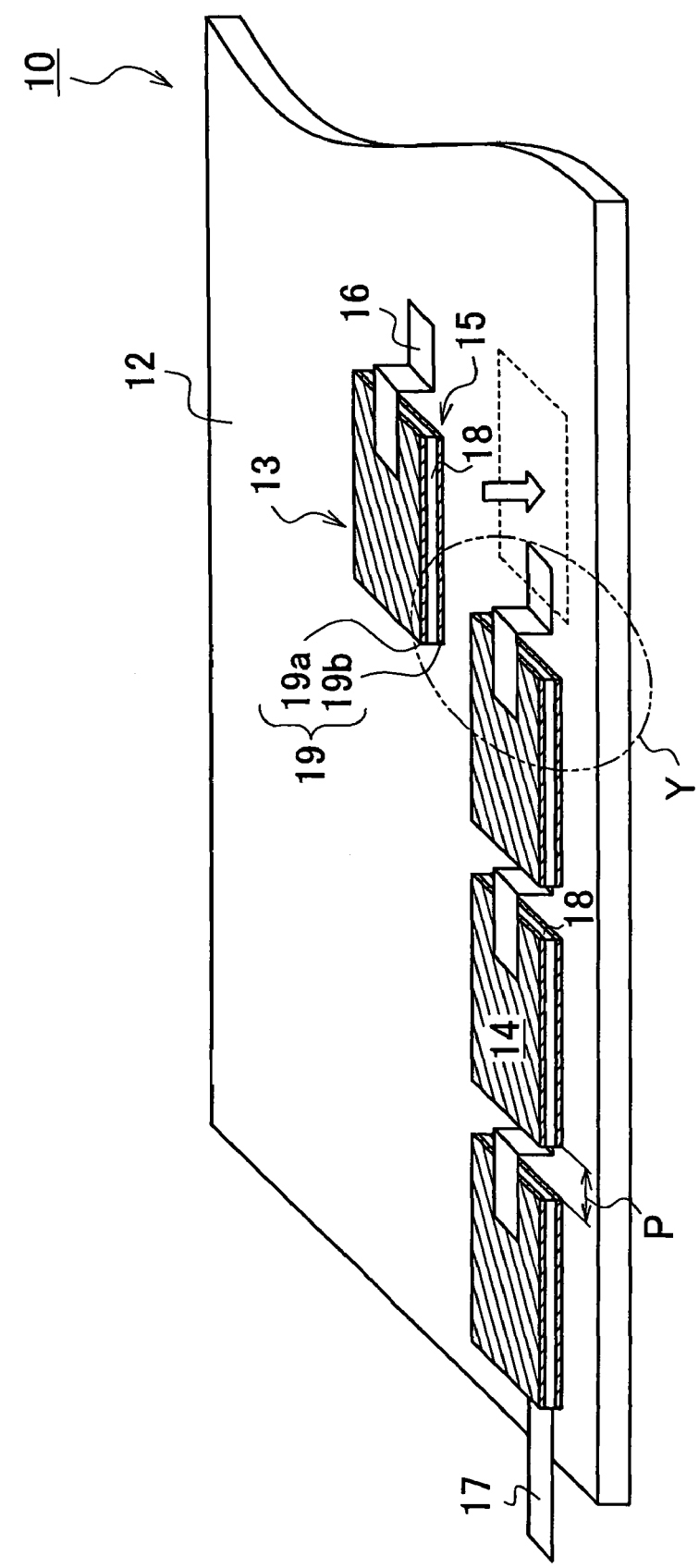

THERMOELECTRIC TRANSDUCER

TECHNICAL FIELD

The present invention relates to a thermoelectric transducer module, particularly to a single device composed of a single thermal electro semiconductor.

BACKGROUND ART

Thermoelectric conversion means the conversion of thermal energy to electric energy and vice versa with use of the Peltier effect or the Seebeck effect. By utilizing the thermoelectric conversion, electricity is taken out from heat flow using the Seebeck effect, or electric current is applied to a material using the Peltier effect, to be able to bring about an endothermic phenomenon or an exothermic phenomenon. Also, the thermoelectric conversion is characterized by no generation of excessive waste at the time of energy conversion due to direct conversion, ability to make efficient use of exhaust heat, maintenance free due to no provision of movable parts such as a motor and a turbine, and so on, and thus attracts attention as a technique for high-efficiency use of energy.

The thermoelectric conversion usually uses metal or semiconductor elements called thermoelectric elements. As shown in FIG. 4, n-type semiconductors 6 and p-type semiconductors 7 are arranged on a substrate 5 and the adjacent semiconductors are connected to each other through an electrode 8. The capacity of this thermoelectric transducer depends on the shapes and materials of these semiconductors, and various studies have been conducted for improving the performance. One of these studies, for example, is to improve the thermoelectric characteristics of the thermoelectric transducer (refer to Patent Document 1).

[Patent Document 1] Japanese Unexamined Patent Application Publication No. Hei 7-211944.

DISCLOSURE OF THE INVENTION

Problems to be Solved by the Invention

The thermoelectric transducer disclosed in Patent Document 1 utilizes a beta-FeSi$_2$-based (β-FeSi$_2$-based) thermoelectric transducer composed of a β-FeSi$_2$-based thermoelectric conversion material containing Sn and/or Pb. Therefore, as the thermoelectric transducer has a low thermal conductivity, a high thermoelectric conversion rate can be obtained. In addition, a β-FeSi$_2$-based thermoelectric conversion material can be prepared by thermal treatment of a metal phase (eutectic alloy of alpha phases and epsilon phases) obtained by dissolving and solidifying a predetermined amount of dopant such as Fe, Si, Mn, or Co, which defines the conductivity type of the material, followed by phase transition to a β phase as a semiconductor. For the β phase transition, it is appreciated that the addition of part of the group XI or X elements, such as Cu, may accelerate the phase transition of the β phase. However, these materials for facilitating phase transition do not contribute to an improvement in the thermoelectric conversion rate of a β-FeSi$_2$-based material at all. It is thought that an accelerator such as Cu does not dissolve and solidify into a β-FeSi$_2$ crystal but it does not contribute to the semiconductor characteristics of the β-FeSi$_2$ crystal because it is present as metal Cu as grain boundaries of the β phase crystals.

Such conventional thermoelectric transducers are generally constructed of p-type and n-type single element unit, which are different from each other depending on the semiconductor characteristics of their respective single element unit. Therefore, thermoelectric transducers have uneven thermoelectric characteristics as a whole, so that they may give rise to unstable outputs, difficulties in impedance matching between the thermoelectric transducers and loads, and a significant decrease in total conversion efficiency compared with that of each single device. Furthermore, each device may be warped by differences between the heat expansion coefficients of the p-type and n-type devices and also the adhesion between the single device and the electrode may be reduced.

The present invention has been carried out in view of the above problems and intends to provide a thermoelectric transducer that overcomes a decrease in conversion efficiency due to uneven semiconductor characteristics of p-type and n-type thermoelectric transducers as described above, and prevents a decrease in the adhesion strength between the respective devices and the electrodes due to thermal expansion coefficient between the respective thermoelectric transducers. In addition, another object of the present invention is to provide a thermoelectric transducer module that can be easily assembled while aiming to improve the thermoelectric conversion efficiency by considering the structure of the single element unit.

Means for Solving the Problems

The present invention provides the followings:

(1) A thermoelectric transducer module equipping: a plurality of single element unit made of the same material and connected to each other on a board, which generates electricity from a temperature difference between a heating surface defined as one surface of the single device and a cooling surface defined as a surface on the opposite side of to the heating surface of the single device, wherein the single element unit comprises semiconductors having the same size and the same shape, where each of the semiconductors comprises a sintered body cell made of a composite metal oxide and a pair of electrodes attached to both surfaces of the heating and cooling surfaces, each electrode of the pair of electrodes has a size equal to or slightly larger than the surface of the sintered body cell, and an electrode on the cooling surface and an electrode on the heating surface of the single element unit adjacent to each other are connected to each other with a lead wire having a width narrower than the width of one side of the electrodes.

According to the invention in (1), semiconductors which have the same dimensions and shape constitute the thermoelectric transducer, thereby allowing the semiconductor characteristics of the respective single element unit to be standardized. As a result, compared with conventional thermoelectric transducers, an improvement in conversion efficiency becomes possible. In addition, as the single device is constructed of a sintered body cell made of a complex metal oxide, improvements in heat resistance and mechanical strength become possible.

Here, the term "thermoelectric transducer module" refers to one containing thermoelectric transducers where single element unit are connected to each other via electrodes and other members (such as insulators). Here, the term "single device" refers to sintered body cell formed in a predetermined shape, a surface defined as a heating surface of the sintered body cell, and a surface defined as a cooling surface on the opposite side with respect to the heating surface, connected to each other through electrodes. The shape of the "sintered body cell" is preferably, but not particularly limited to, a simple cubic shape, such as a rectangular solid or a regular hexahedron, for obtaining high thermoelectric conversion efficiency.

In addition, the size of the "electrode" connected to the sintered body cell is approximately equal to the size of each of the heating and cooling surfaces for improving the thermoelectric conversion rate. Preferably, the electrode is configured to cover each surface.

Here, the term "approximately equal" means that the size of the electrode is larger than the respective areas of the heating and cooling surfaces but smaller than the total area of the heating or cooling surfaces and the areas of the four sides of the sintered body cell. Furthermore, the "lead wire" connected to the electrode may be integrally formed with the electrode. The lead wire is shorter than the width of one side of the heating or cooling surface (narrow width), and the ratio of the area of the electrode to the cross sectional area of the lead wire is in the range of 1000:2 to 1000:35, more preferably in the range of 1000:5 to 1000:25 for the following reasons: If the lead wire is thicker than the above range, no temperature difference can be occurred. If the lead wire is thinner than usual, it may be difficult for current to flow. Furthermore, the materials of both the electrode and the lead wire include metals having good electric conductivity, such as gold, silver, copper, and aluminum. These members are preferably the same.

Here, the term "approximately equal" means that the size of the electrode is larger than the respective areas of the heating and cooling surfaces but smaller than the total area of the heating or cooling surfaces and the areas of the four sides of the sintered body cell. Furthermore, the "lead wire" connected to the electrode may be integrally formed with the electrode. The lead wire is narrower than the width of one side of the heating or cooling surface (narrow width), and the ratio of the area of the electrode to the cross sectional area of the lead wire is in the range of 1000:2 to 1000:35, more preferably in the range of 1000:5 to 1000:25 for the following reasons: If the lead wire has a ratio greater than the above range, no temperature difference can occur. If the lead wire has a ratio less than the above range, it may be difficult for current to flow. Furthermore, the materials of both the electrode and the lead wire include metals having good electric conductivity, such as gold, silver, copper, and aluminum. These members are preferably the same.

Furthermore, if the single device has a mean thermal conductivity of $K_I$ and an area of $S_E$ equal to that of the electrode; the lead wire has a mean thermal conductivity of $K_L$ and a cross-section area of $S_L$; the distance between the high-temperature surface and the low-temperature surface (or the heating surface and the cooling surface) is D; and the lead wire extends almost vertically from the high-temperature surface to the low-temperature surface, the thermal resistances $R_1$ and $R_L$ between both surfaces can be described as follows (A is a constant):

$$R_I = A*D*S_E/K_I$$

$$R_L = A*D*S_L/K_L$$

Therefore, because it is considered that there is the same temperature difference between both surfaces, the ratio $R_{therm}$ of the amount of heat carried by the single device to the amount of heat carried by the lead wire can be expressed as follows:

$$R_{therm} = (K_I*S_L)/(K_L*S_E)$$

Therefore, if there is no considerable difference in thermal conductivity between both sides and there is a relationship of $S_L \ll S_E$, it is appreciated that the amount of heat carried by the lead wire can be ignored. If the thermal conductivities are $K_I \ll L_K$, it is preferable to reconsider the above conditions. After all, it will be determined by a relative relationship between the area ratio and the thermal conductivity ratio.

(2) A thermoelectric transducer as described in (1), wherein the single element units are connected to each other in series.

According to the invention in (2), the thermoelectric transducer has a simple structure because of single element unit being connected in series, which simplifies production. In addition, this leads to more a simpler production process, reducing production costs.

(3) A thermoelectric transducer as described in (1) and (2), wherein the composite metal oxide is an oxide equipping an alkaline-earth metal element, a rare-earth element, and manganese.

According to the invention in (3), the oxide of composite metal elements is an oxide comprising of an alkaline-earth metal element, a rare-earth element, and manganese, so that an improvement in heat resistance at high temperatures can be attained. In addition, it is preferable to use calcium for the alkaline-earth metal element, and it is also preferable to use yttrium or lanthanum for the rare-earth element. Concretely, any of the Perovskite-type $CaMnO_3$-based composite oxides can be given as examples. Among the Perovskite-type $CaMnO_3$-based composite oxides, those represented by the general formula $Ca_{(1-x)}MxMnO_3$ (wherein M is yttrium or lanthanum, $0.001 \leq x \leq 0.005$) are preferred.

According to the thermoelectric transducer of the present invention, the single element unit used comprise semiconductors of the same type, so that an improvement in conversion efficiency can be attained. In addition, compared to conventional thermoelectric transducers, the thermoelectric transducer of the present invention can be produced more easily because of its simpler structure, thereby leading to a reduction in production costs. Furthermore, the single device is constructed of a sintered body cell of a composite metal oxide, so that the mechanical strength thereof can be improved.

BRIEF DESCRIPTION OF THE DRAWINGS

FIG. 2A is a diagram for illustrating the process of producing the thermoelectric transducer module of the preferred embodiment of the present invention;

PREFERRED MODE FOR CARRYING OUT THE INVENTION

Figure 1A:
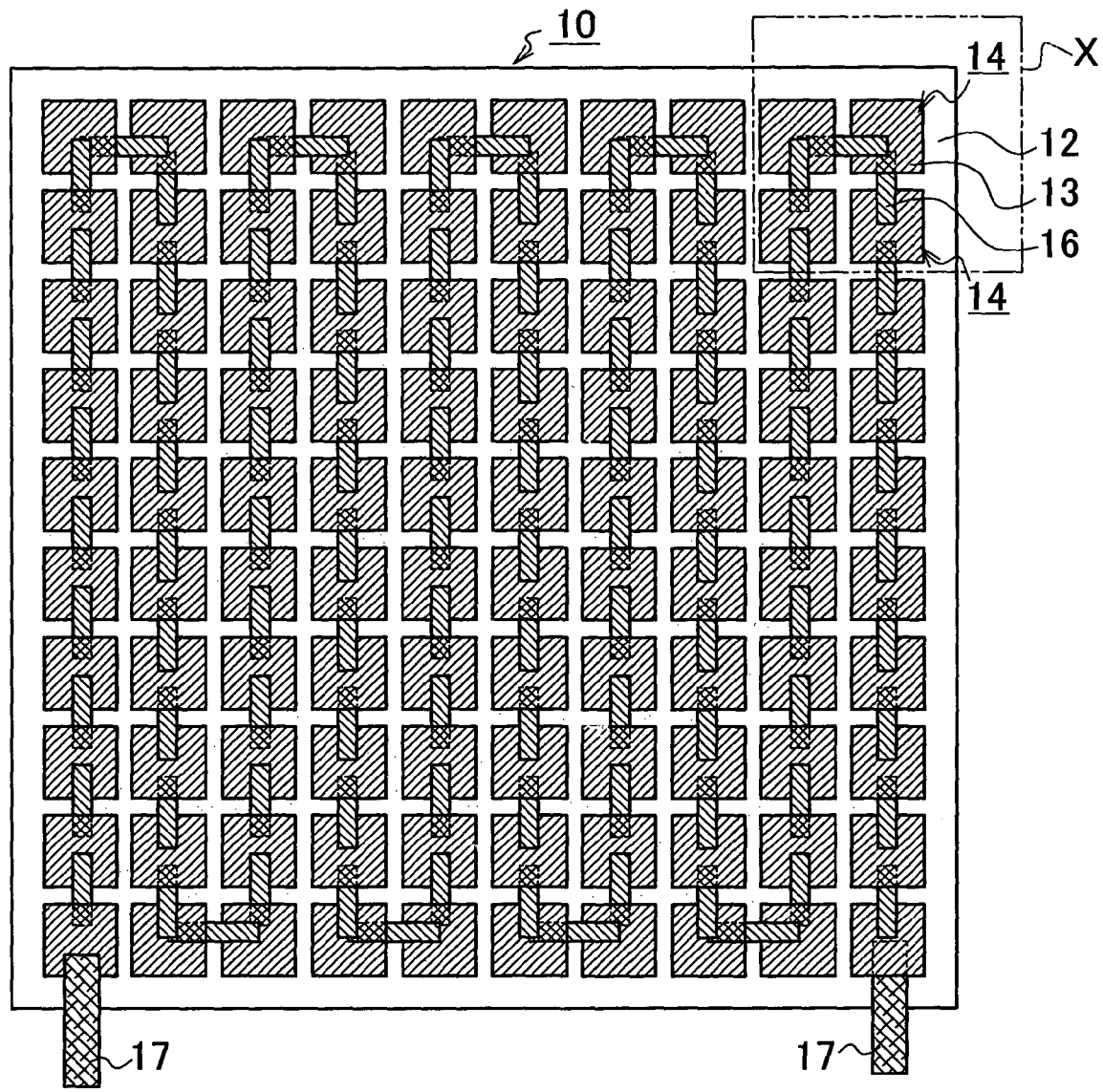
FIG. 1A is a top view of a thermoelectric transducer module of a preferred embodiment of the present invention.

FIG. 1A is a top view showing a thermoelectric transducer module 10 of a preferred embodiment of the present invention.

Figure 1B:
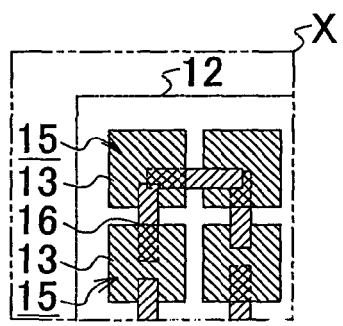
FIG. 1B is a detailed view of the thermoelectric transducer module of the preferred embodiment of the present invention.

FIG. 1B is a view of the portion X extracted from the thermoelectric transducer module and showing from the backside thereof (bottom view) through a board 12. As shown in FIGS. 1A and 1B, single element unit 13, each of which consists of the same type of semiconductor comprising a sintered body cell, are arranged on the board 12. In addition, the surface of the single element unit 13 touching the board 12 is a cooling surface 15 and the opposite surface thereof is a heating surface 14. In this embodiment, a film-shaped electrode having the same area as that of the heating surface 14 is attached on the heating surface 14 to unite it with the sintered body cell. In this embodiment, furthermore, an n-type semiconductor is used but the present invention is not limited to this.

Figure 1C:
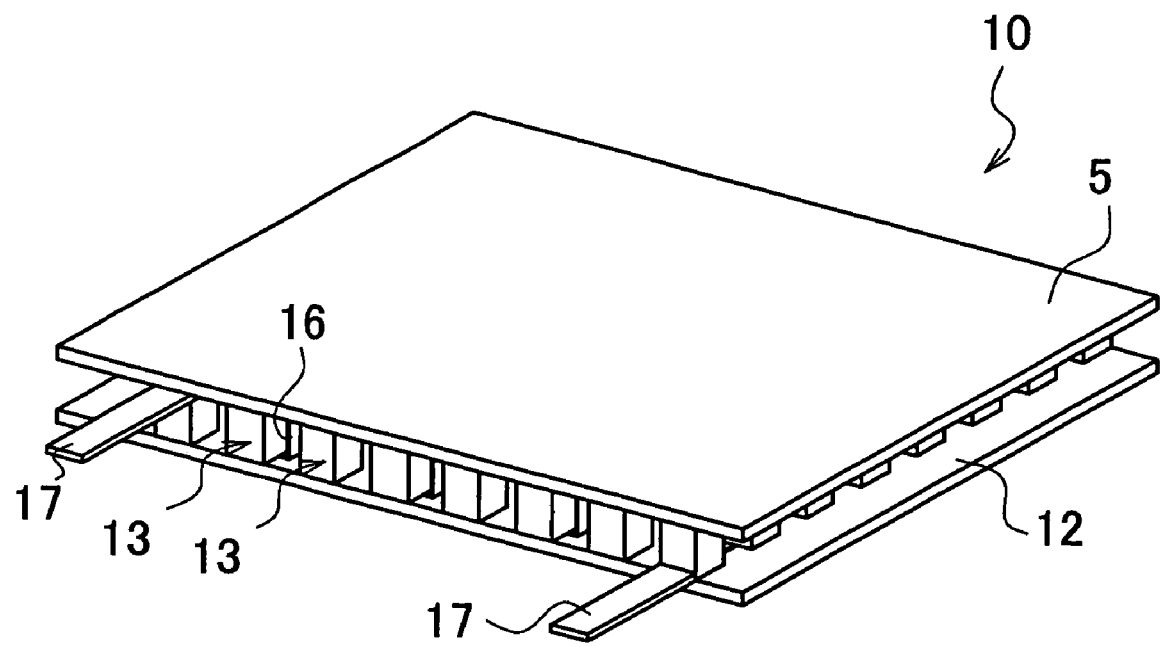
FIG. 1C is a perspective view of the thermoelectric transducer module of the preferred embodiment of the present invention.

FIG. 1C is a perspective view showing the external appearance of the thermoelectric transducer module 10 of the preferred embodiment of the present invention. The respective single element unit 13 are sandwiched between a board 5 and a board 12 and connected to each other by lead wires 16 in series.

In addition, as shown in FIG. 2A, the lead wires 16 are arranged on these structural elements. In the serial connection, an electrode 19a on the heating surface of one single element unit 13 is connected with an electrode 19b on the cooling surface of the adjacent single device. Such a serial connection is established by attaching a conductive ribbon having a width narrower than the electrodes 19a and 19b on the electrode 19a on the heating surface, the extended portion thereof is then bent downward, and the portion thereof reaching the board 12 is further bent in a crank shape so as to be placed under the adjacent single device.

The thermoelectric transducer module 10 of the present invention heats the board 12 while cooling the cooling surface of the single element unit 13, thereby converting thermal energy absorbed from the board 12 into electric energy. A collector 17 collects the electric energy obtained and electric power is then supplied therefrom to an external electrode. However, at the time of heating the board 12, the heat thereof is transmitted to the top surface (cooling surface) of the single element unit 13 through the lead wire 16, so that the cooling surface can be heated up and the conversion efficiency may tend to fall. For reducing the heat transfer, a thin film is used for the lead wire 16. The thin film used for the lead wire 16 preferably has a thickness of 50 μm and the material thereof is preferably, but not particularly limited to, a metal having a smaller electric resistance than that of the single device generally employed in the art.

FIG. 2A is a perspective diagram that illustrates the process of producing a thermal electric transducer module 10 of a preferred embodiment of the present invention. A lead wire 16 is connected to make a connection between an electrode on the cooling surface of a single element unit 13 and an electrode on the heating surface of the adjacent single device. As shown in the figure, these structural elements are assembled such that the lead wire 16 is attached on the heating surface of a sintered body cell 18 integrally formed with the electrode and the single element unit 13 are then attached on a board 12 to make a serial connection thereof. In addition, the conversion efficiency of the thermoelectric transducer module 10 depends on the pitch between the respective single element unit and the dimensions thereof. The single element unit 13 preferably has an area of 5 mm×5 mm to 20 mm×20 mm and a height of 1 mm to 5 mm. The pitch P between the single element units 13 is preferably 0.1 mm to 5 mm, more preferably 0.5 mm to 2 mm. For example, if the pitch P is narrower than 0.1 mm, the integration degree of single element unit is high but thermal problems may occur.

Figure 2B:
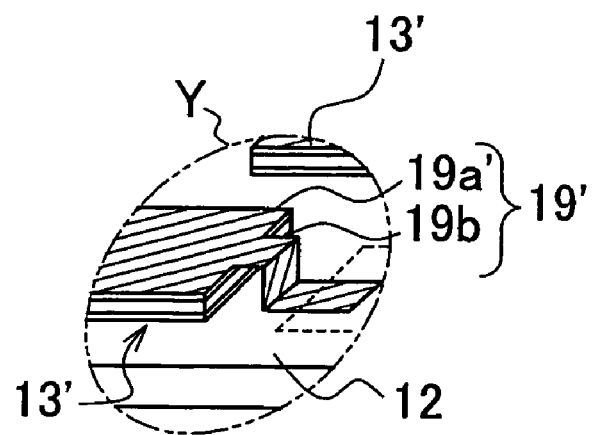
FIG. 2B is a detailed diagram for illustrating the process of producing the thermoelectric transducer module of the preferred embodiment of the present invention.

In addition, FIG. 2B is a view of portion Y for another embodiment in which an electrode 19' is integrally formed with a lead wire. As shown in FIG. 2B, part of the electrode 19a' on the heating surface is bent downward and the portion thereof reaching the board 12 is further bent in a crank shape so as to be placed under the adjacent single element unit 13'. An electrode 19b on the cooling surface may be of the same size as that of the above embodiment.

Figure 2C:
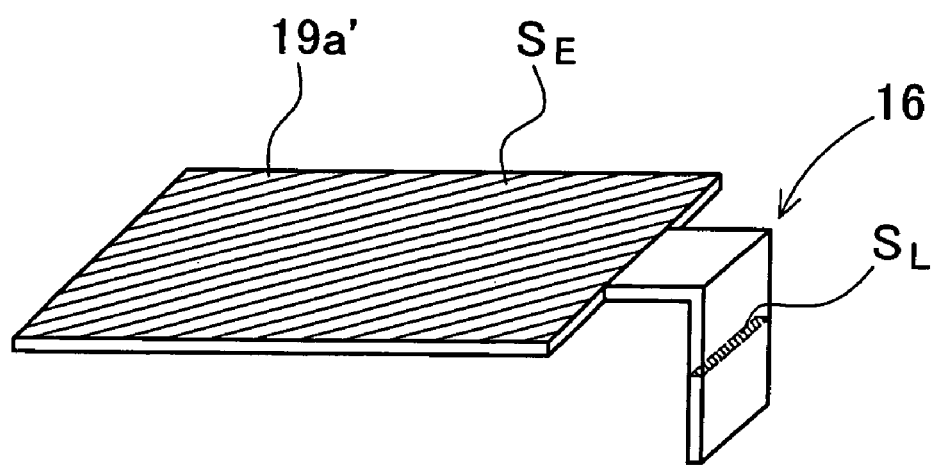
FIG. 2C is a perspective view of the parts of the electrodes and leads of the thermoelectric transducer module of the preferred embodiment of the present invention.

FIG. 2C is a perspective view showing parts of the typical electrode 19a' and lead wire 16. From the figure, it is seen that the area $S_E$ of the electrode 19a' is sufficiently larger than the cross-sectional area $S_L$ of the lead wire 16.

Figure 3:
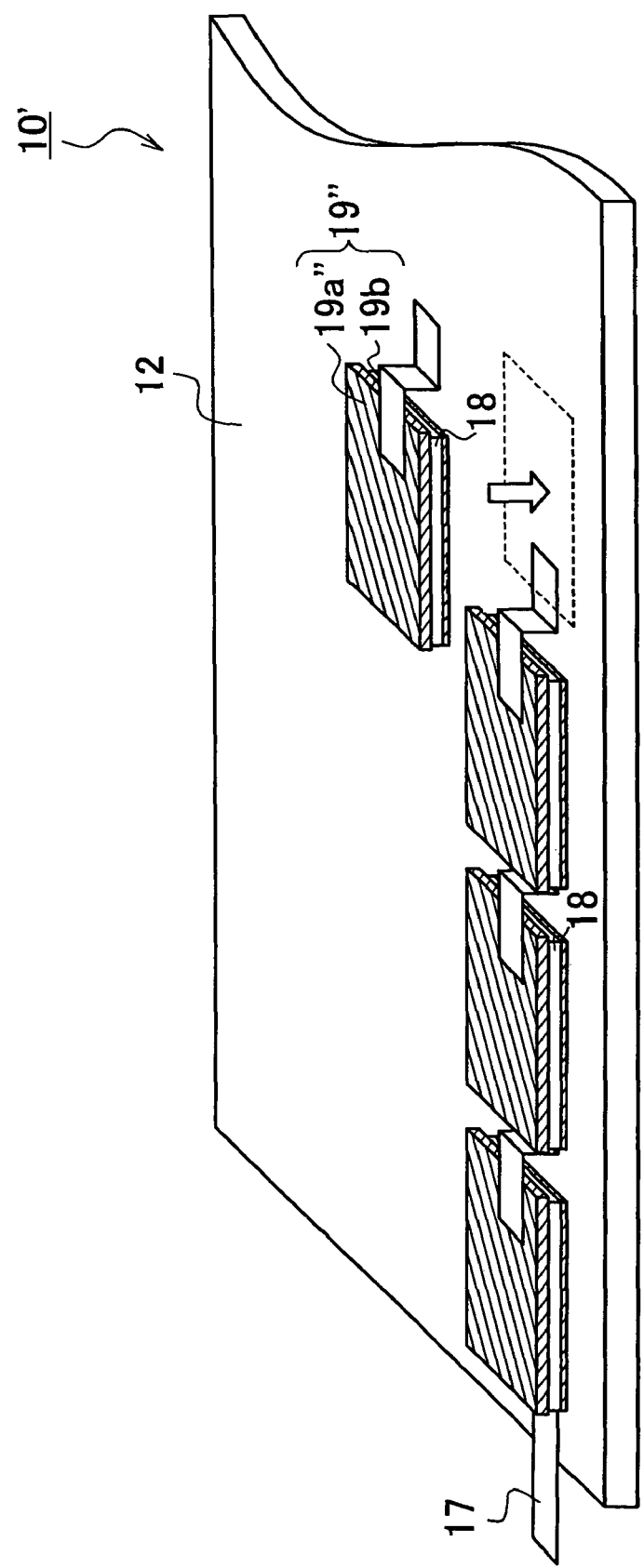
FIG. 3 is a diagram for illustrating another thermoelectric transducer module as a modified example with respect to the preferred embodiment of the present invention.
Figure 4:
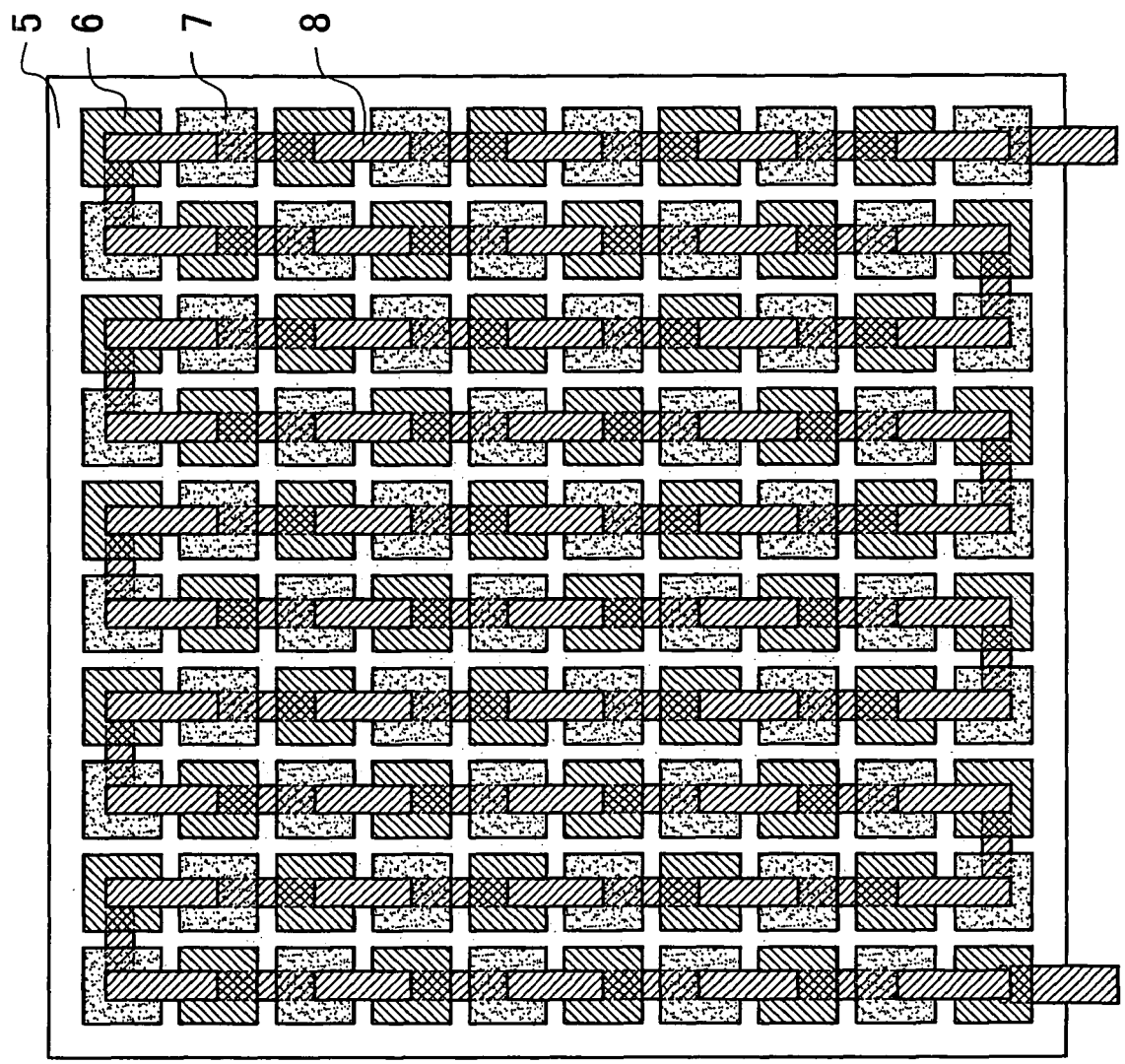
FIG. 4 is a top view of a conventional thermoelectric transducer.

FIG. 3 is a perspective view showing the process of producing another thermoelectric transducer module 10' of another preferred embodiment of the present invention. This embodiment is configured in the same manner as that of the above embodiment, except that the size of the electrode 19a" on the heating surface of the single device is larger than that of a sintered body cell 18. In addition, the electrode 19b on the cooling surface may be of the same size as that of the above embodiment or may be of the same size as that of an electrode 19a" on the heating surface. In the thermoelectric transducer module 10' of the present embodiment, the electrode 19" is protruded from the sintered body cell 18 and plays a role of a roof, thereby providing a large effect of shielding the heat downward and also extending the temperature difference between the high and low temperatures of the sintered body cell. In addition, there is an advantage of improved power generation efficiency.

EXAMPLES

Preparation of Single Element Unit

Calcium carbonate, manganese carbonate, and yttrium oxide were weighted to Ca/Mn/Y=0.95/1.0/0.05 and then wet-blending in carried out with a ball mill for 18 hours. After that, the mixture was filtered and dried, followed by sintering at 1,000° C. for 10 hours in the atmosphere. The calcination powder thus obtained was pulverized and then molded by uniaxial pressing at a pressure of 1 t/cm². Subsequently, it was sintered at 1,150° C. for 5 hours in the atmosphere, thereby obtaining a sintered body of $Ca_{0.95}Y_{0.05}MnO_3$. The dimensions of the sintered body were about 9 mm×9 mm×2.5 mm.

Silver paste was applied to both sides of the sintered body cell 18 and then sintered at 700° C. to form an electrode. The Seebeck coefficient and resistance of the device were measured; a Seebeck coefficient of 145 μV/K and a resistance of 7.5Ω. In addition, the Seebeck coefficient was calculated by providing a temperature difference on the top and bottom surfaces of the thermoelectric transducer and extrapolating the potential difference thus obtained into S=dV/dT (S=Seebeck coefficient, dV=potential difference between two points, and T=temperature difference between two points). In addition, the resistance was determined by a two-terminal method. The term "two-terminal method" refers to a method in which two electrode terminals are attached at both ends of a sample and a current is passed through the sample and the potential difference thus caused is measured using the same electrodes. A silver ribbon (3 mm in width and 50 μm in thickness) was fixed to the sintered body cell 18 with silver paste, thereby resulting in a single element unit.

Assembly of Thermoelectric Transducer

On an alumina ($Al_2O_3$) board with dimensions of 100 mm×100 mm×2 mm, 100 single element units were arranged in series, followed by overlapping and fixing with an additional alumina board having the same dimensions. Subsequently, pressure was lightly applied from the top and bottom while heating at 700° C. for 30 minutes, thereby obtaining a thermoelectric transducer (FIG. 1A).

A heater heated the bottom surface of the thermoelectric transducer while the top surface thereof was cooled to provide the top and bottom surface with a temperature difference of about 160 K. Consequently, a non-load voltage of 2.32 V and a maximum power of 1.02 W were obtained.

The invention claimed is:

1. A thermoelectric conversion module comprising:
a plurality of base elements comprising a same material, a temperature difference between a heated surface and a cooled surface of each of the plurality of base elements allowing each of the plurality of base elements to generate power;
a pair of plates that interposes the plurality of base elements; and
a lead wire,
wherein each of the plurality of base elements comprises a semiconductor having a same size and a same shape, the semiconductor including:
a sintered cell comprising a composite metal oxide and having a heated surface and a cooled surface; and
a first electrode attached to the heated surface of the sintered cell and a second electrode attached to the cooled surface of the sintered cell of each of the plurality of base elements,
wherein the first electrode attached to the heated surface of the sintered cell, the heated surface comprising an upper surface of the sintered cell, is configured to include an area greater than an area of the heated surface of the sintered cell such that the electrode includes a portion extending beyond the sintered cell in a horizontal direction, and
wherein the lead wire, which is an element structurally separate from said first electrode and said second electrode, includes a width smaller than a width of the pair of electrodes and electrically connects the first electrode attached to the heated surface of one of the plurality of base elements to the electrode attached to the cooled surface of an adjacent one of the plurality of base elements.

2. A thermoelectric conversion module comprising:
a plurality of base elements, each of the base elements comprising:
two surfaces opposite to each other, the two surfaces comprising a high-temperature surface and a low-temperature surface;
a sintered cell comprising a composite metal oxide and having a high-temperature surface and a low-temperature surface;
a first electrode placed in the high-temperature surface of each of the base elements and comprising a cell facing surface facing the high-temperature surface of the sintered cell, the cell facing surface being in contact with the high-temperature surface of the sintered cell, the high-temperature surface comprising an upper surface of the sintered cell; and
a second electrode placed in the low-temperature surface, the sintered cell being interposed between the first electrode and the second electrode;
a plate on which the base elements are placed in parallel, the plate being in contact with the high-temperature surface of each of the base elements; and
a lead wire, which is an element structurally separate from the first electrode and the second electrode, electrically connecting an adjacent pair of the base elements, the lead wire connecting a high-temperature surface of one of the adjacent pair of the base elements to a low-temperature surface of an other of the adjacent pair of the base elements such that the base elements are electrically connected in series, the lead wire having a width that is smaller than a width of the first electrode,
wherein a distance between the high-temperature surface and the low-temperature surface of each of the base elements is substantially equal for the plurality of base elements, and
wherein the cell facing surface has an area that is larger than an area of the high-temperature surface such that the first electrode includes a portion extending beyond the sintered cell in a horizontal direction.

3. A thermoelectric conversion module according to claim 1, wherein the one of the plurality of base elements is connected to the adjacent one of the plurality of base elements in series.

4. A thermoelectric conversion module according to claim 1, wherein the composite metal oxide comprises an oxide comprising an alkaline-earth metal element, a rare-earth element, and manganese.

5. A thermoelectric conversion module according to claim 3, wherein the composite metal oxide comprises an oxide comprising an alkaline-earth metal element, a rare-earth element, and manganese.

6. A thermoelectric conversion module according to claim 1, wherein a ratio of the area of one of the pair of electrodes to a cross sectional area of the lead wire is in a range of 1000:2 to 1000:35.

7. A thermoelectric conversion module according to claim 2, wherein a ratio of an area of the first electrode to a cross sectional area of the lead wire is in a range of 1000:2 to 1000:35.

8. A thermoelectric conversion module according to claim 5, wherein the rare-earth element comprises one of yttrium and lanthanum.

9. A thermoelectric conversion module according to claim 5, wherein the composite metal oxide comprises a general formula $Ca_{(1-x)}MxMnO_3$, where M comprises one of yttrium and lanthanum and x is in a range from 0.001 to 0.005).

10. A thermoelectric conversion module according to claim 2, wherein the sintered cell is integrally formed with the first electrode.

11. A thermoelectric conversion module according to claim 2, wherein a pitch between the base elements is in a range from 0.1 mm to 0.5 mm.

12. A thermoelectric conversion module according to claim 2, wherein the first electrode is integrally formed with the lead wire.

13. A thermoelectric conversion module according to claim 1, wherein a portion of the first electrode attached to the heated surface of the one of the plurality of base elements is bent towards one of the pair of plates formed nearest to the cooled surface of the one of the plurality of base elements.

14. A thermoelectric conversion module according to claim 13, wherein the bent portion of the first electrode attached to the heated surface of the one of the plurality of base elements comprises a portion that is contacting the one of the pair of plates formed nearest to the cooled surface of the one of the plurality of base elements, and
wherein the contacting portion of the bent portion of the first electrode attached to the heated surface of the one of the plurality of base elements is bent to be placed under the adjacent one of the plurality of base elements.

15. A thermoelectric conversion module according to claim 1, wherein the lead wire is bent in a crank shape so as to be fixed to an end of each of the first electrode and the second electrode.

* * * * *